(12) United States Patent
Harkins et al.

(10) Patent No.: US 12,424,740 B2
(45) Date of Patent: Sep. 23, 2025

(54) PHASED ANTENNA ARRAY CALIBRATION STATION

(71) Applicant: Raytheon Company, Waltham, MA (US)

(72) Inventors: Brian J. Harkins, Westford, MA (US); Dmitrios Kolokithas, Billerica, MA (US); Kevin R. O'Donnell, South Grafton, MA (US); Christopher J. Yafrate, Coopersburg, PA (US)

(73) Assignee: Raytheon Company, Arlington, VA (US)

( * ) Notice: Subject to any disclaimer, the term of this patent is extended or adjusted under 35 U.S.C. 154(b) by 438 days.

(21) Appl. No.: 18/154,974

(22) Filed: Jan. 16, 2023

(65) Prior Publication Data

US 2024/0243469 A1    Jul. 18, 2024

(51) Int. Cl.
*H01Q 3/26*    (2006.01)
*G01R 29/10*    (2006.01)

(52) U.S. Cl.
CPC .......... *H01Q 3/267* (2013.01); *G01R 29/105* (2013.01)

(58) Field of Classification Search
CPC .... G01R 29/0821; G01R 29/105; G01S 3/267
See application file for complete search history.

(56) References Cited

U.S. PATENT DOCUMENTS

| | | | | |
|---|---|---|---|---|
| 4,864,315 | A | * | 9/1989 | Mohuchy ............. G01R 29/105 343/777 |
| 10,879,608 | B2 | | 12/2020 | Salazar-Cerreno et al. |
| 2005/0253762 | A1 | | 11/2005 | Tsai et al. |
| 2014/0300519 | A1 | * | 10/2014 | Estebe ................. G01R 29/105 343/703 |

(Continued)

FOREIGN PATENT DOCUMENTS

| | | | |
|---|---|---|---|
| EP | 3837561 B1 | 6/2022 | |
| FR | 3031188 A1 * | 7/2016 | ........... G01R 29/105 |
| TW | 201935027 A | 9/2019 | |

OTHER PUBLICATIONS

Office Action dated Oct. 11, 2024 in connection with Chinese Patent Application No. 112143350, 8 pages.

(Continued)

*Primary Examiner* — Vladimir Magloire
*Assistant Examiner* — Fred H Mull (57) ABSTRACT

A phased antenna array calibration station comprising an enclosure comprising a first rectangular interior room comprising at least one exterior door, a power source device, a cooling device, and a controller device configured to control power, cooling, and testing within a second interior room and an antenna under test (AUT); and the second rectangular interior room comprising at least one interior door abutting the first interior room, an opening in one wall of the second interior room, a radio frequency (RF) absorbing material covering all interior surfaces of the second interior room, and at least one movable electromagnetic interference (EMI)

(Continued)

shield configured to form an EMI seal around the opening and active elements of AUT aligned with opening; and support fixture configured to support AUT and align active elements of AUT with opening to second interior room comprising cooling and electronic unit (CEU) configured to cool AUT and operate AUT.

20 Claims, 10 Drawing Sheets

(56) References Cited

U.S. PATENT DOCUMENTS

2017/0115334 A1  4/2017  Symes
2022/0128623 A1*  4/2022  Chang .................. G01R 29/105

OTHER PUBLICATIONS

International Search Report and Written Opinion of the International Searching Authority dated Feb. 26, 2024 in connection with International Patent Application No. PCT/US2023/078428, 14 pages.

\* cited by examiner

PHASED ANTENNA ARRAY CALIBRATION STATION

BACKGROUND

Figure 1:
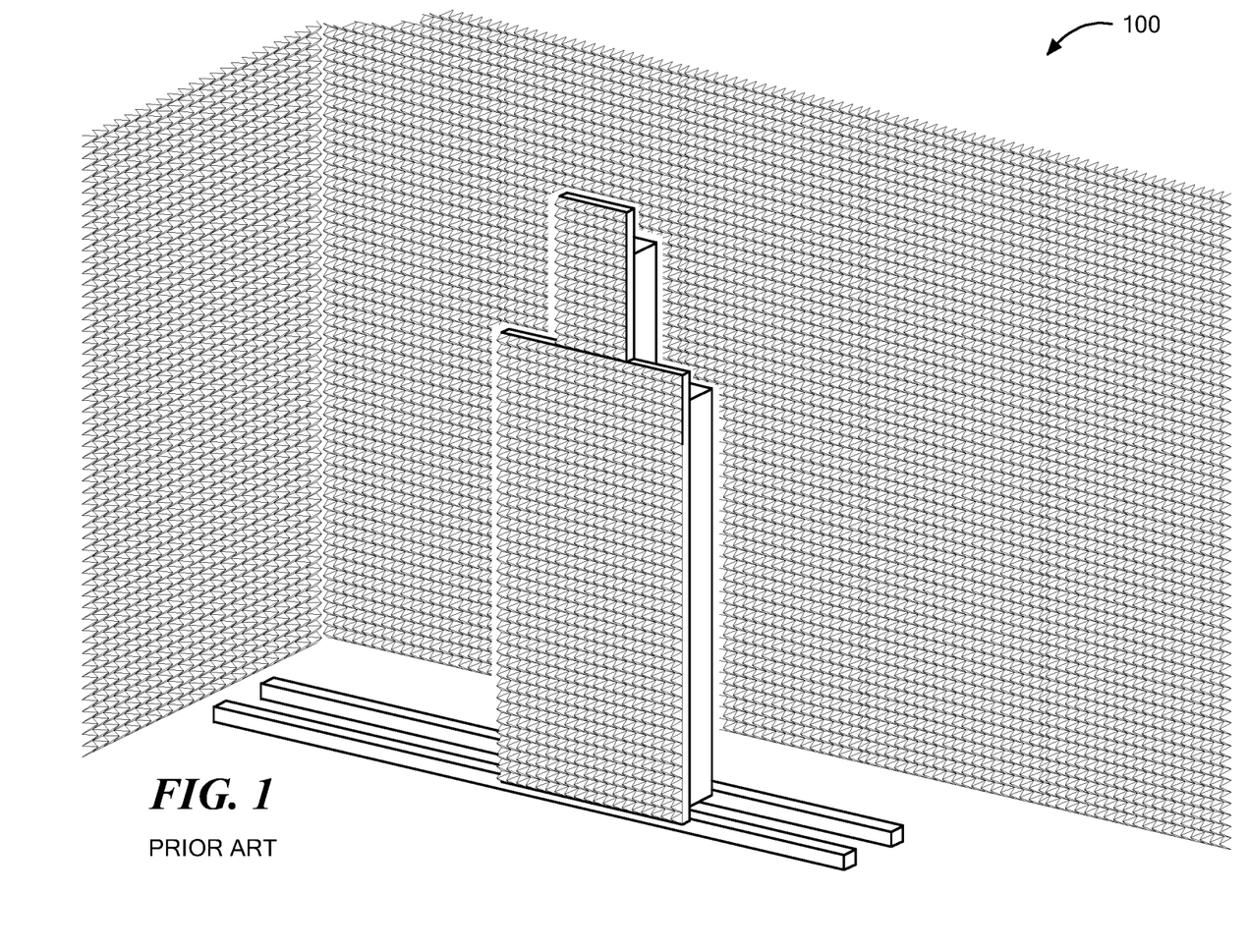
FIG. 1 is an illustration of an array antenna in a conventional fixed anechoic chamber.

Multiple radio detection and ranging (RADAR) programs compete for few near-field ranges (NFRs) which limits production capacity. Conventional nearfield array calibration is performed in an anechoic chamber 100 of sufficient size, as illustrated in FIG. 1. For high-rate production environments, it is impractical to build new anechoic chambers as demand grows.

Figure 2:
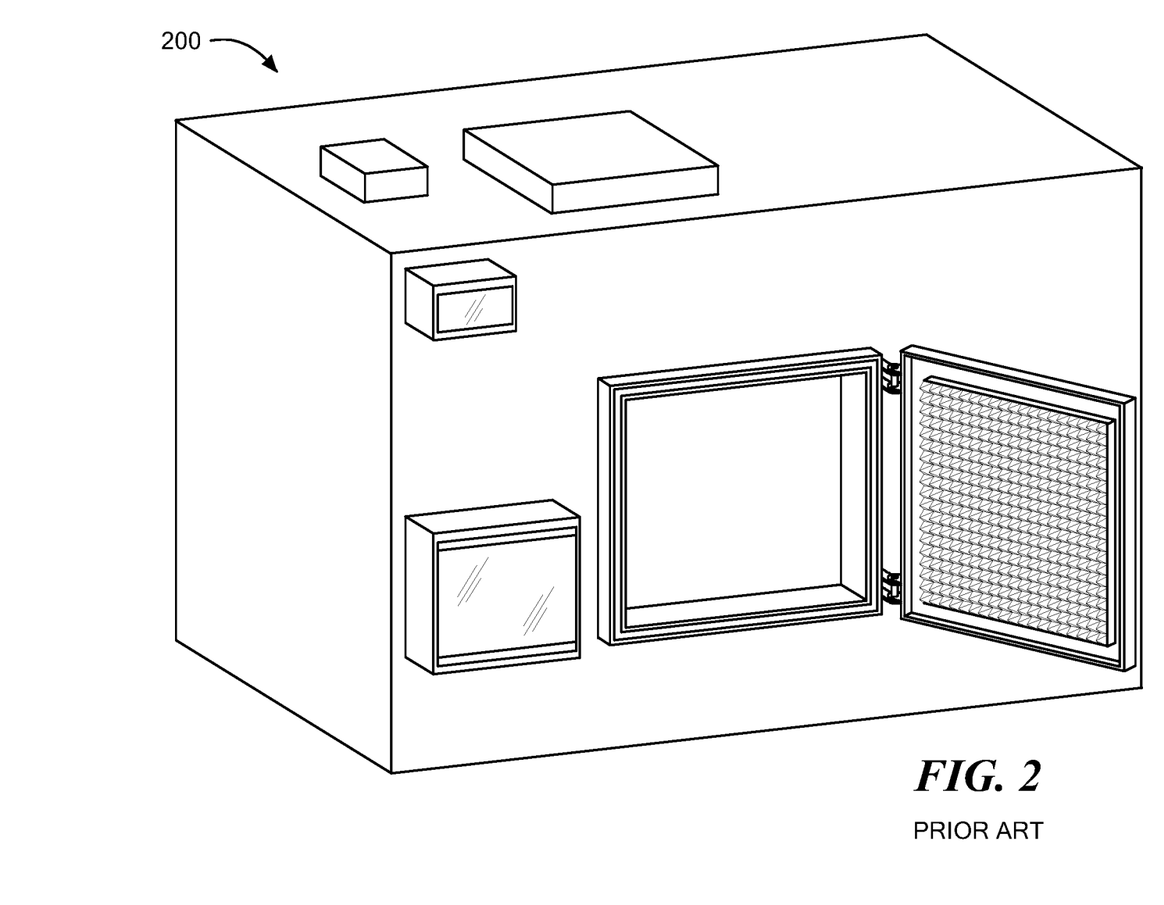
FIG. 2 is an illustration of an exemplary prior art portable anechoic chamber.

A conventional portable anechoic chamber 200, as illustrated in FIG. 2, encloses an array under test (AUT) and thus supports relatively small antennas. Portable calibration stations may require assembly/disassembly (akin to a fixed anechoic chamber) or support very small antennas.

Near-field scanners are typically employed in large test chambers outfitted for a wide range of array sizes and frequencies. Such a test chamber is typically built to accommodate the largest antenna to be tested and the most stressing requirements of any antenna to be tested in the test chamber. Thus, such test chambers are very expensive, not portable, and require permanent, dedicated real estate. Most conventional test chambers include support equipment, such as cranes, hoists, or rails, which facilitate antenna positioning. However, array alignment with a test chamber may be a very labor intensive process which often takes several days to accomplish.

Radio Frequency (RF) load boxes have been used to support low power antenna radiation and antenna checkout prior to moving the antenna into a test chamber. Such capability is limited to low power radiation at the active element level providing a functional checkout outside a near field range. A load box does not provide sufficient space for a near field scanner, nor does it provide an adequate quiet zone for mutual coupling measurements.

A conventional near field range test chamber has a fixed location, is expensive, is configured for a single use, requires manual antenna alignment, requires test configurations to be tailored for the AUT, and limits test chamber quantity, availability, and flexibility due to cost. In addition, converting a conventional test chamber configured for a large antenna to one configured for a small antenna over multiple frequency bands further adds cost.

SUMMARY

In accordance with the concepts described herein, exemplary devices and methods provide a phased antenna-array calibration station (PACS) that enables advanced integration and characterization of large antennas for orders of magnitude lower cost versus a conventional test chamber with respect to a size of an electromagnetic interference (EMI) controlled environment.

In accordance with the concepts described herein, exemplary devices and methods provide a PACS that enables an EMI tight enclosure, radio frequency (RF) operation in a portable electromagnetic (EM) controlled environment with non-active elements of an AUT outside of the PACS.

In accordance with the concepts described herein, exemplary devices and methods provide a PACS that enables EM quiet environments and high accuracy alignment required for calibration.

In accordance with the concepts described herein, exemplary devices and methods provide a PACS that enables transportability and flexibility to relocate the PACS to temporary facilities and to add surge capacity as needed.

DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

The present disclosure provides a PACS that enables advanced integration and characterization of large antennas for orders of magnitude greater efficiency in the use of factory space and lower cost versus a conventional test chamber.

Figure 3:
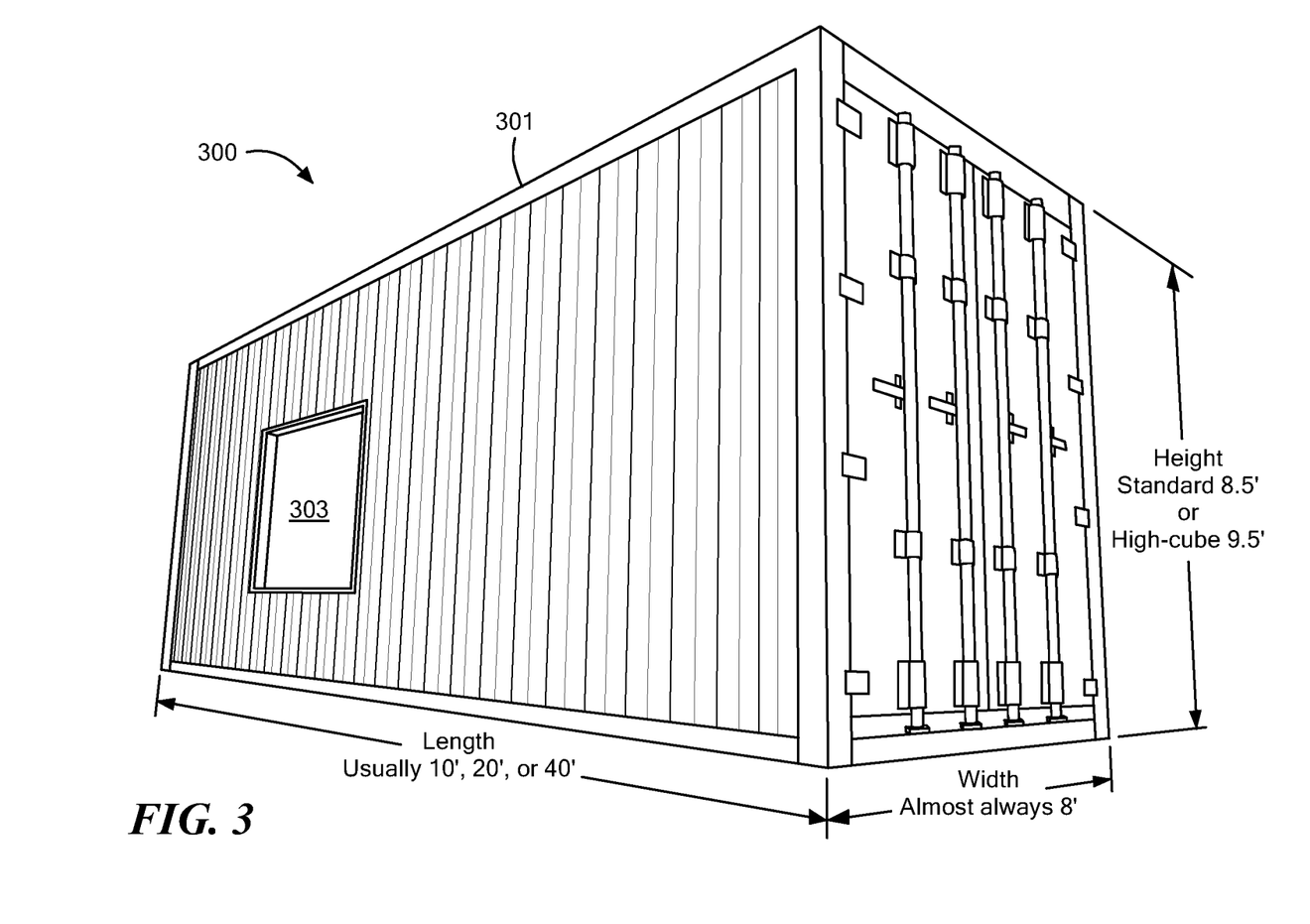
FIG. 3 is a perspective view of an embodiment of a PACS of the present disclosure employing a shipping container.

FIG. 3 is a perspective view of an embodiment of a PACS 300 of the present disclosure employing a modified, inexpensive container 301 (e.g., a container express (CONEX) shipping container). The container is conductive (e.g., metal but the container 301 may be any suitable conductive material). The container 301 includes a first interior room for providing power, control signals, and cooling, a second interior room (not shown in FIG. 3 but shown as 409 in FIG. 4 described below) for providing an anechoic chamber, and an opening 303 for abutting active elements of an AUT (not shown) (e.g., a phased array RADAR antenna) to be tested, calibrated, etc. An RF absorbing material covers the interior surfaces of the second interior room to enable the second interior room to function as an anechoic chamber. The opening 303 is EMI sealed around the active elements of the AUT abutted with the opening 303. A support fixture (not shown) supports the parts of the AUT outside of the container 301 (e.g., all but the active elements of the AUT). In an exemplary embodiment, the length of the PACS 300 may be 20 feet, 40 feet, or any other practical length. The width of the PACS 300 may be 8 feet. The height of the PACS 300 may be 8.5 feet or 9.5. However, the present disclosure is not limited thereto, and any suitable lengths, heights, and widths may be used.

The size of the second interior room of the PACS may be determined by at least two factors (e.g., an operating frequency of a phased array antenna and a size of the phased array antenna). The antenna frequencies that may be tested in the PACS includes, but is not limited to, a range of 2 GHz to 18 GHz (e.g., an L band to an Ku band) but may include higher frequencies (e.g., Ka-Band) with additional test equipment. In an exemplary embodiment, the second interior room may be as small as 0.5 meters by 0.5 meters and as large as 2.0 meters by 2.0 meters. However, the present disclosure is not limited thereto.

The PACS 300 may be both repositioned and relocated in its entirety with forklifts or other means. The PACS 300 simplifies factory floor configuration and supports removal when not required.

Figure 4:
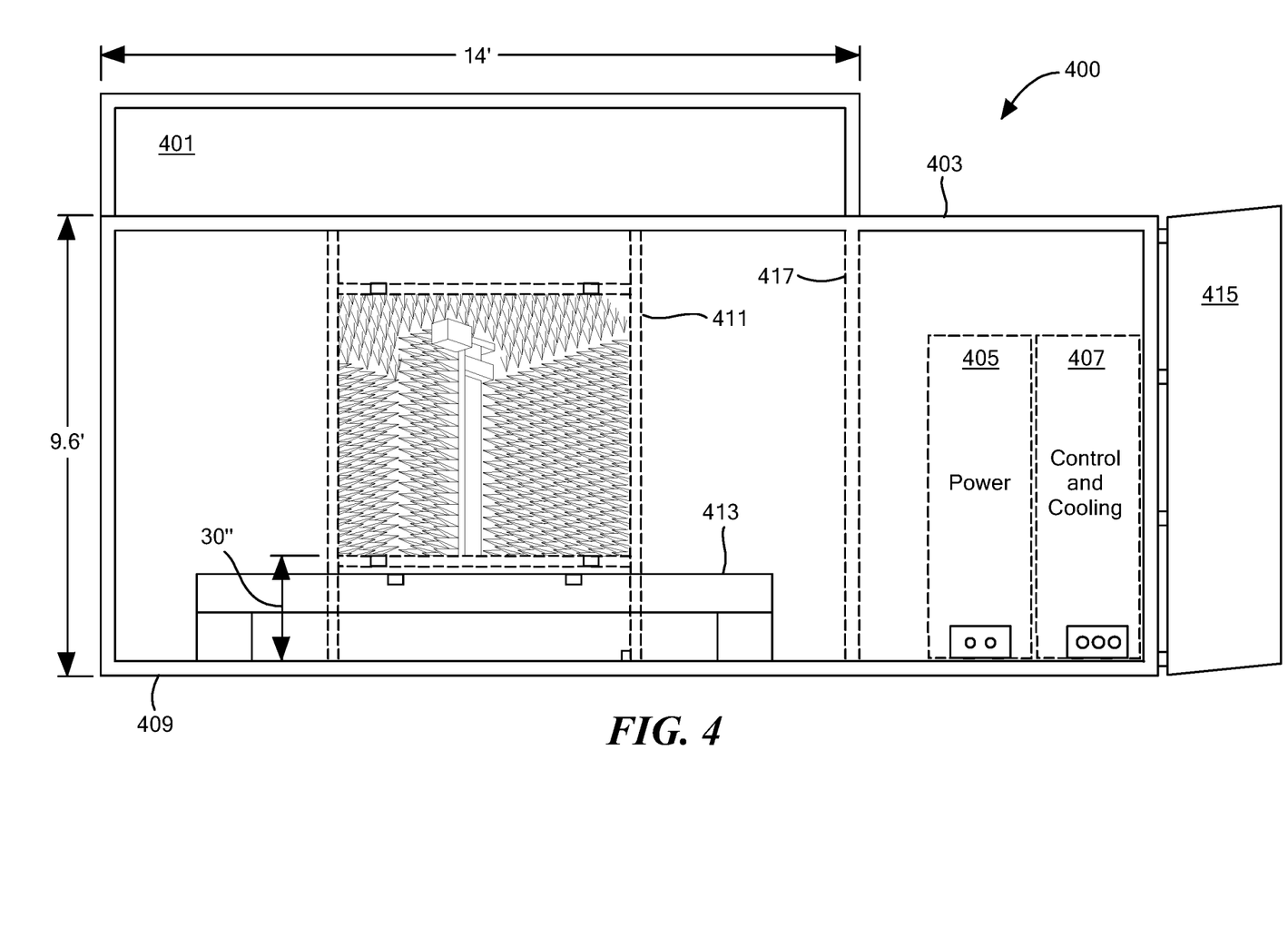
FIG. 4 is a side view of an embodiment of a PACS of the present disclosure with added headroom.

FIG. 4 is a side view of an embodiment of a PACS 400 of the present disclosure with added headroom 401 as compared to the PACS 300 of FIG. 3. The PACS 400 comprises a first interior room 403, having at least one exterior door 415, for providing power 405, control and cooling 407; a second interior room 409, abutting the first interior room 403 and having at least one interior door 417, with a continuous opening into the added headroom 401 for providing an anechoic chamber (e.g., all of the surfaces of the second interior room 409 and the added headroom 401 are conductive and all of the interior surfaces of the second interior room 409 and the added headroom 401 are lined with RF absorbing material (e.g., pyramidal RF absorbing material and a wedge absorber on the interior sources of the second interior room 409 or a block absorber on a floor of the second interior room 409)); and an opening 411 to the second interior room 409 for abutting active elements of an AUT (not shown) (e.g., a phased array RADAR antenna) to be tested, calibrated, etc. The opening 411 is EMI sealed around the active elements of the AUT abutted with the opening 411. A support fixture 413 supports the parts of the AUT outside of the PACS 400 (e.g., all but the active elements of the AUT). A support fixture 413 supports the AUT, where the non-active elements of the AUT are outside of the PACS 400 when the AUT is properly positioned for testing by the PACS 400, and where the active elements of the AUT are positioned just within the opening 411. The support fixture 413 mechanically aligns the AUT with the opening 411 in the PACS 400. In an exemplary embodiment, the length of the added headroom 401 and the length of the second interior room 409 may each be 14 feet, the height of the first interior room 403 and the second interior room may each be 9.6 feet, and the height of the support fixture 413 may be 30 inches. However, the present disclosure is not limited thereto, and any suitable lengths and heights of these elements may be used.

Simple mechanical alignment of an AUT to the opening 411 of the PACS 400 via the support fixture 413 dramatically reduces the time to position and align an AUT relative to a scan plane. Interfaces to the power 405, the control and cooling 407, and the support fixture 413 enable the PACS 400 to operate across bands and frequencies.

The present disclosure eliminates the need for expensive, permanent near field range (NFR) facilities for calibration and small array characterization. Since the present disclosure enables an AUT to be positioned (e.g., rolled toward) at the opening in the PACS, rather than being required to completely fit within the PACS, the present disclosure enables advanced integration and characterization of larger antennas as compared to a conventional anechoic chamber. The present disclosure provides a very low-cost alternative to building a fixed facility, NFR. The present disclosure also simplifies test set up and data collection, allowing technician-level operation and significantly reducing dependency on a subject matter expert (SME).

The PACS is both moveable and relocatable to either optimize a factory floor or relocate the PACS offsite to meet/alleviate production capacity limitations, reduce factory cost, or productize for customers who demand greater roles in life cycle support at service depots.

The present disclosure dramatically reduces a factory footprint for electromagnetically controlled environments by locating and positioning all but active elements of an AUT outside the PACS. The present disclosure also provides an end-to-end scalable solution to include power supplies and distribution, array control, scan control, and data recording for modern digital arrays.

The present disclosure positions all but the active elements of an AUT outside the PACS for near-field scans, which enables scanning of much larger antennas relative to an EM-controlled test space as compared to the conventional method of requiring an antenna to be completely within an anechoic chamber.

The support fixture 413 enables mechanical alignment for quickly positioning and aligning an AUT with a planar near field scanner, which eliminates the need for extensive, manual laser alignment required by conventional anechoic chambers. The present disclosure reduces dependency on permanent NFRs to alleviate bottlenecks with small array production surges.

Figure 5:
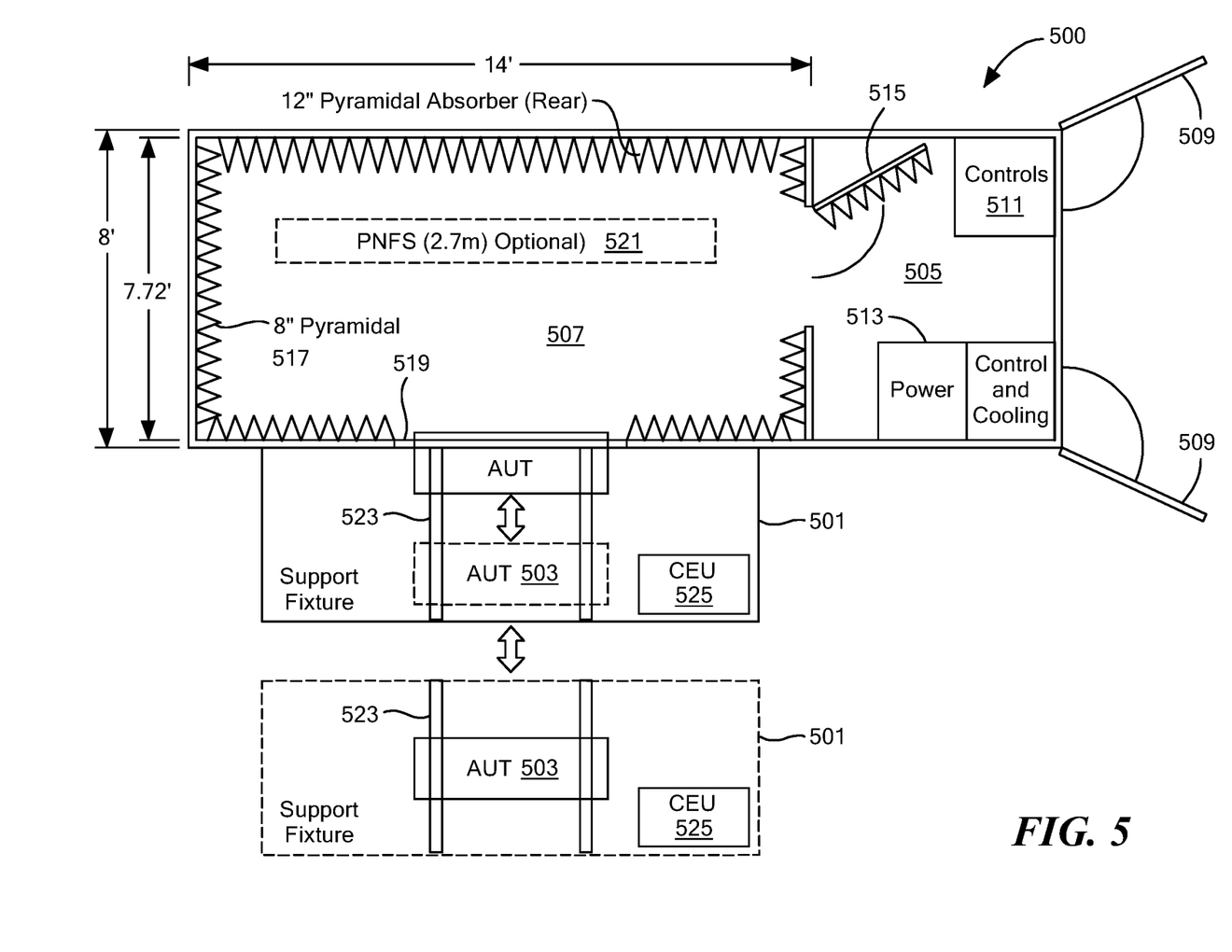
FIG. 5 is a top view of an embodiment of a PACS of the present disclosure illustrating positioning of a support fixture and an AUT.

FIG. 5 is a top view of an embodiment of a PACS 500 of the present disclosure illustrating positioning of a support fixture 501 and an AUT 503. The PACS 500 comprises a first interior room 505, a second interior room 507, and the support fixture 501 on which the AUT 503 is positioned. The first interior room 505 has at least one exterior door 509 for accessing the first interior room 505. A control device 511 is positioned in the first interior room 505 for controlling the PACS 500 electronically and environmentally (e.g., controlling power supplies, distributing power, controlling the AUT 503, controlling a planar near-field scanner (PNFS) 521, and recording data). A power supply 513 is positioned in the first interior room 505 for providing electrical power and electrical power distribution to the PACS 500 (e.g., direct current (DC) power and alternating current (AC) power). The PNFS 521 may be placed sufficiently close to the AUT 503 and sufficient far away from the interior walls of the second interior room 507.

The second interior room 507 abuts the first interior room 505 and has at least one door 515 for accessing the second interior room 507 via the first interior room 505. The second interior room 507 also includes RF absorbing material 517 covering the interior surfaces of the second interior room 507 to enable the second interior room 507 to function as an anechoic chamber. In an exemplary embodiment, the RF absorbing material 517 may be pyramidal RF absorbing material of various thicknesses (e.g., 12 inches thick on a wall opposite to an opening 519 in the second interior room 507 and 8 inches thick everywhere else. However, the present disclosure is not limited thereto, and any suitable thicknesses and relationships of thicknesses may be used. The second interior room 507 includes the opening 519 through which active elements of the AUT 503 are positioned for testing by the PACS 500. Testing may be done with or without the PNFS 521 positioned within the second interior room 507 and aligned with the AUT 503.

The support fixture 501 includes rails 523 for supporting and positioning the AUT 503 with regard to the opening 519 in the second interior room 519 and/or to align the AUT 503 with the PNFS 521. The AUT may be air cooled. Alternatively, the support fixture 501 may include a cooling/electronic unit (CEU) 525 for cooling the AUT 503 and controlling the movement of both the support fixture 501 toward and away from the opening 519 in the second interior room 507 and the movement of the AUT 503 on the rails 523 forward and backward on the support fixture 501. The AUT 503 is properly positioned for testing when active elements of the AUT 503 are positioned within the opening 519 of the second interior room 507 of the PACS 500 and/or in alignment with the PNFS 521 when used. In an exemplary embodiment, both the PACS 500 and the support fixture 501 include mechanisms for mechanically aligning and positioning the AUT 503 such that array measurement planarity is achieved without any further manual alignment. In an exemplary embodiment, the CEU 525 may include liquid cooling of the AUT 503. The CEU 525 is configurable if required based on the requirements of the AUT 503 (e.g., liquid coolant, conditioned air flow, etc.).

In an exemplary embodiment, the length of the second interior room 507 is 14 feet, the outside width of the second interior room 507 is 8 feet, and the inside width of the second interior room 507 is approximately 7.7 feet. However, the present disclosure is not limited thereto, and any suitable widths and ratios of widths may be used.

The PACS 500 may be used without the PNFS 521 for advanced integration and determining mutual coupling of the AUT 503, where mutual coupling is determined after AUT alignment and calibration. The PACS 500 may be used with the PNFS 521 for AUT alignment, calibration, and AUT pattern collection. The PACS 500 may be used without the PNFS 521 by removing the PNFS 521 from the PACS 500 or by turning off the PNFS 521 while the PNFS 521 is in the PACS 500. The present disclosure provides a standalone PACS 500 with the support fixture 503 that enables integration and calibration capacity without requiring a new permanent facility.

Figure 6:
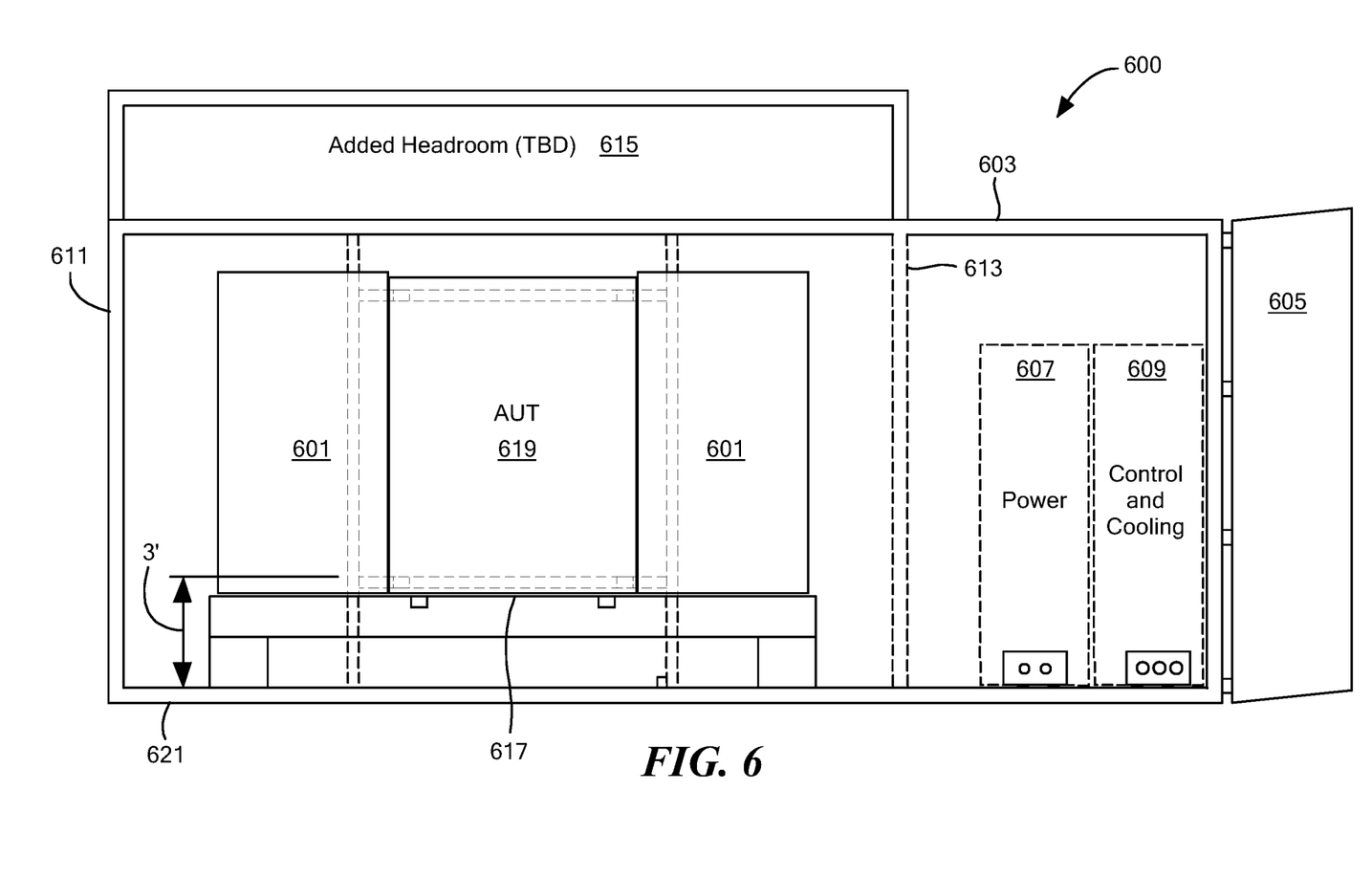
FIG. 6 is a side view of an embodiment of a PACS of the present disclosure with closed EMI shields.
Figure 7:
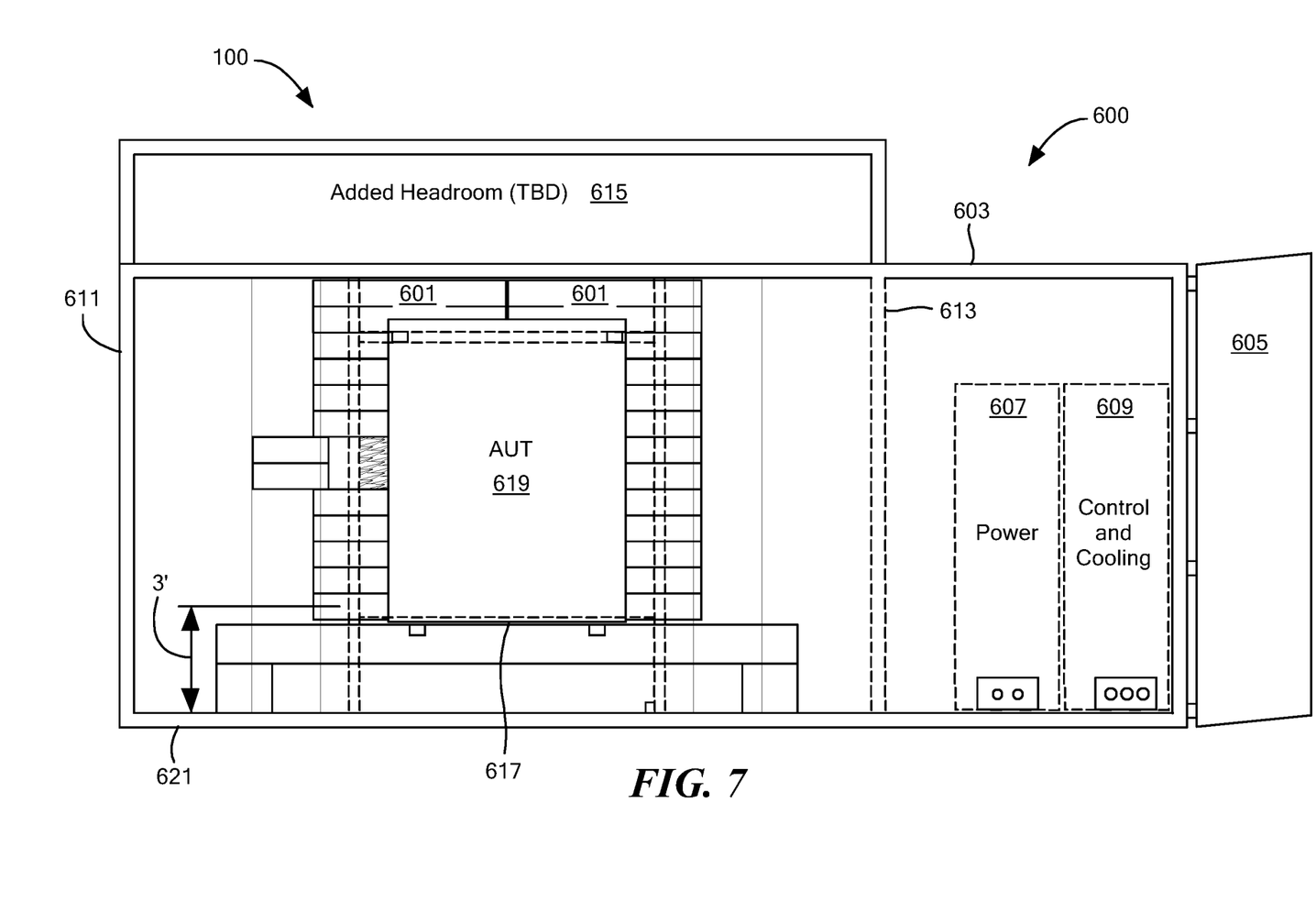
FIG. 7 is a side view of an embodiment of a PACS of the present disclosure with open and closed EMI shields.

FIGS. 6 and 7 are side views of an embodiment of a PACS 600 of the present disclosure with closed and open EMI shields 601, respectively. The PACS 600 comprises a first interior room 603, having at least one exterior door 605, for providing power 607, control and cooling 609; a second interior room 611, abutting the first interior room 603 and having at least one interior door 613, with a continuous opening into an added headroom 615 for providing an anechoic chamber (e.g., all of the surfaces of the second interior room 611 and the added headroom 615 are conductive and all of the interior surfaces of the second interior room 611 and the added headroom 615 are lined with RF absorbing material (e.g., pyramidal RF absorbing material and a wedge absorber on the interior sources of the second interior room 611 or a block absorber on a floor of the second interior room 611)); an opening 617 to the second interior room 611 for abutting active elements of an AUT 619, and a support fixture 621 on which the AUT 619 is positioned and aligned with the opening 617. The opening 617 is EMI sealed around the active elements of the AUT 619 abutted with the opening 617 by a plurality of slidable EMI shield 601 on either side of the opening 617. Each EMI shield 601 is a conductive surface (e.g., metal or any other suitable conductive material) with RF absorbing material (e.g., pyramidal RF absorbing material and a wedge absorber on the interior sources of the second interior room 611 or a block absorber on a floor of the second interior room 611) on a side facing the interior of the second interior room 611 so that each EMI shield 601 has the same anechoic properties as the second interior room 611. The support fixture 621 supports the AUT 619, where the non-active structural elements of the AUT 619 are outside of the PACS 600 when the AUT 619 is properly positioned for testing by the PACS 600, and where the active elements of the AUT 619 are positioned just within the opening 617. The support fixture 621 mechanically aligns the AUT 619 with the opening 617 in the PACS 600. In an exemplary embodiment, the height of the support fixture 621 may be 3 feet. However, the present disclosure is not limited thereto, and any suitable height may be used. The EMI shields 601 prevent EM leakage into the second interior room 611 from the opening 617 around the AUT 619.

The present disclosure enables a PACS that is a relocatable anechoic chamber that supports production surges without permanently occupying factory floor space. The PACS reduces physical factory footprint square footage by greater than 10 times and enables a reconfigurable assembly line, either at a factory or in an offsite location to support NFR demands. An all-inclusive calibration test set in the PACS would not require hours to boresight the AUT, a dedicated permanent test chamber, or multiple rooms of processing equipment as would a conventional anechoic chamber.

The present disclosure enables a PACS to position an AUT outside of an anechoic chamber. A support fixture auto-aligns the AUT with a PNFS mechanically. An EMI shield and seal maintain EMI integrity inside the second interior room of the PACS. The PACS includes standalone power (e.g., AC and DC), environmental conditioning of the second interior room, a data collection system, an array controller, and a shock and vibration isolated PNFS. The support fixture includes rails, an alignment mechanism, and a CEU for cooling the AUT and to work with the PACS.

Figure 8A:
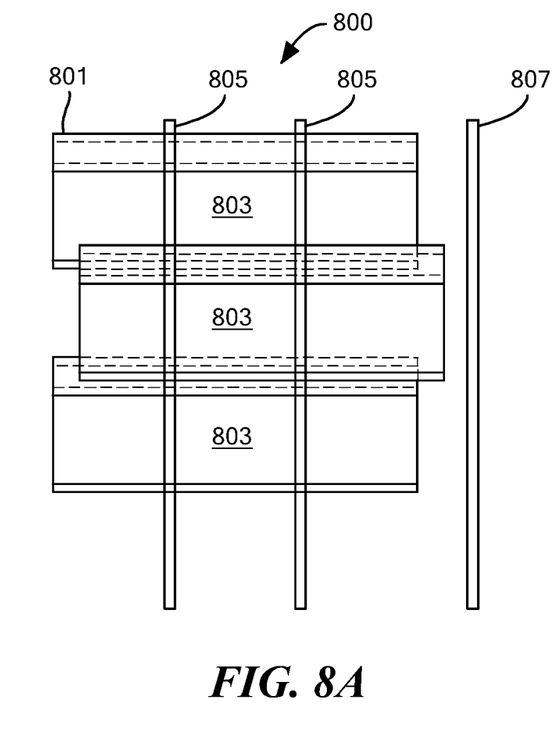
FIGS. 8A, 8B, and 8C illustrate a front view, a side view, and a rear view of EMI shield panels of the present disclosure, respectively.
Figure 8B:
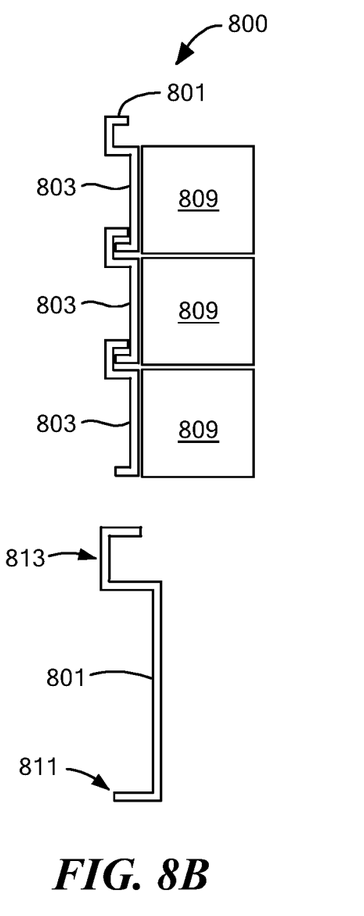
Figure 8C:
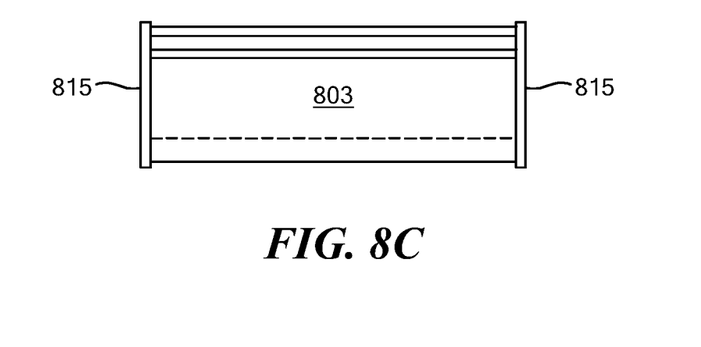

FIGS. 8A, 8B, and 8C illustrate a front view, a side view, and a rear view of EMI shield panels 803 of the present disclosure, respectively. In FIG. 8A, an EMI shield 800 comprises the individually slidable EMI shield panels 803, which are individually moveable left and right along a guide 801 that includes at least one vertical support rail 805 and an end-stop rail 807.

In FIG. 8B, each individually slidable EMI shield panel 803 of the EMI shield 800 includes an RF absorbing material 809 (e.g., a pyramidal RF absorbing material and a wedge absorber on the interior sources of the second interior room or a block absorber on a floor of the second interior room) facing the second interior room of the PACS that has the same anechoic characteristics as the RF absorbing material attached to the inner surfaces of the second interior room and the added headroom. The individually slidable EMI shield panels 803 are individually moveable left and right along a guide 801, where the guide 801 includes a first guide 811 facing one direction and a slotted guide 813 facing an opposite direction. The guide 801 is a conductive material (e.g., a metal such as Aluminum, but the present disclosure is not limited thereto).

In FIG. 8C, the individually slidable EMI shield panels 803 each include edge covers 815 with EMI fingers (or similar) to abut the AUT.

Figure 9:
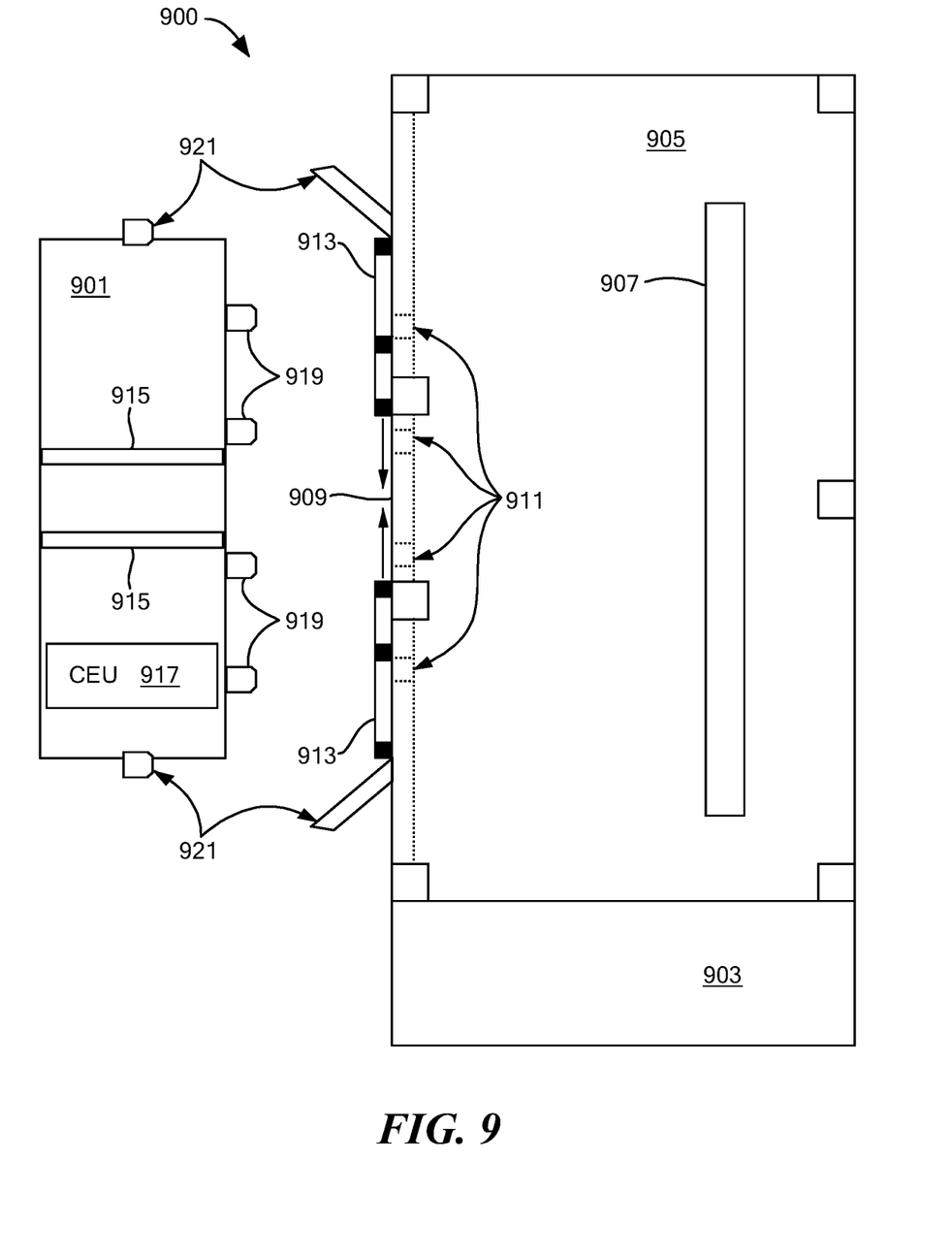
FIG. 9 is a top view of an embodiment of a PACS of the present disclosure illustrating auto-alignment of a support fixture.

FIG. 9 is a top view of an embodiment of a PACS 900 of the present disclosure illustrating auto-alignment of a support fixture 901. The PACS 900 comprises a first interior room 903, a second interior room 905, and the support fixture 901 on which an AUT (not shown) is positioned. The first interior room 903 has at least one exterior door (not shown) for accessing the first interior room 903. A control device (not shown) is positioned in the first interior room 903 for controlling the PACS 900 electronically and environmentally (e.g., controlling power supplies, distributing power, controlling the AUT, controlling a PNFS 907, and recording data). A power supply (not shown) is positioned in the first interior room 903 for providing electrical power and electrical power distribution to the PACS 900 (e.g., direct current (DC) power and alternating current (AC) power).

The second interior room 905 abuts the first interior room 903 and has at least one door (not shown) for accessing the second interior room 905 via the first interior room 903. The second interior room 905 also includes RF absorbing material (not shown) covering the interior surfaces of the second interior room 905 to enable the second interior room 905 to function as an anechoic chamber. In an exemplary embodiment, the RF absorbing material may be pyramidal RF absorbing material of various thicknesses (e.g., 12 inches thick on a wall opposite to an opening 909 in the second interior room 905 and 8 inches thick everywhere else. However, the present disclosure is not limited thereto, and any suitable thicknesses and relationships of thicknesses may be used. The second interior room 905 includes the opening 909 through which active elements of the AUT are positioned for testing by the PACS 900. Testing may be done with or without the PNFS 907 positioned within the second interior room 905 and aligned with the AUT. The second interior room 905 includes at least one precision alignment receivers 911 to auto-align the AUT on the support fixture 901 with the opening 909 and the PNFS 907. An external surface of the second interior room 905 includes at least one EMI shield 913 for blocking EMI around the space in the opening 909 not occupied by the AUT.

The support fixture 901 includes rails 915 for supporting and positioning the AUT with regard to the opening 909 in the second interior room 905 and/or to align the AUT with the PNFS 907. The support fixture 901 also includes a CEU 917 for cooling the AUT and controlling the movement of both the support fixture 901 toward and away from the opening 909 in the second interior room 905 and the movement of the AUT on the rails 915 forward and backward on the support fixture 901. The AUT is properly positioned for testing when active elements of the AUT are positioned within the opening 909 of the second interior room 905 of the PACS 900 and/or in alignment with the PNFS 907 when used. In an exemplary embodiment, the PACS 900 includes at least one precision alignment receiver 911 and the support fixture 901 includes at least one precision alignment pins 919 for mechanically aligning and positioning the AUT such that array measurement planarity is achieved without any further manual alignment. The PACS 900 and the support fixture 901 may also include at least one latch and clamp 921 to secure the support fixture 901 to the PACS 900.

Figure 10:
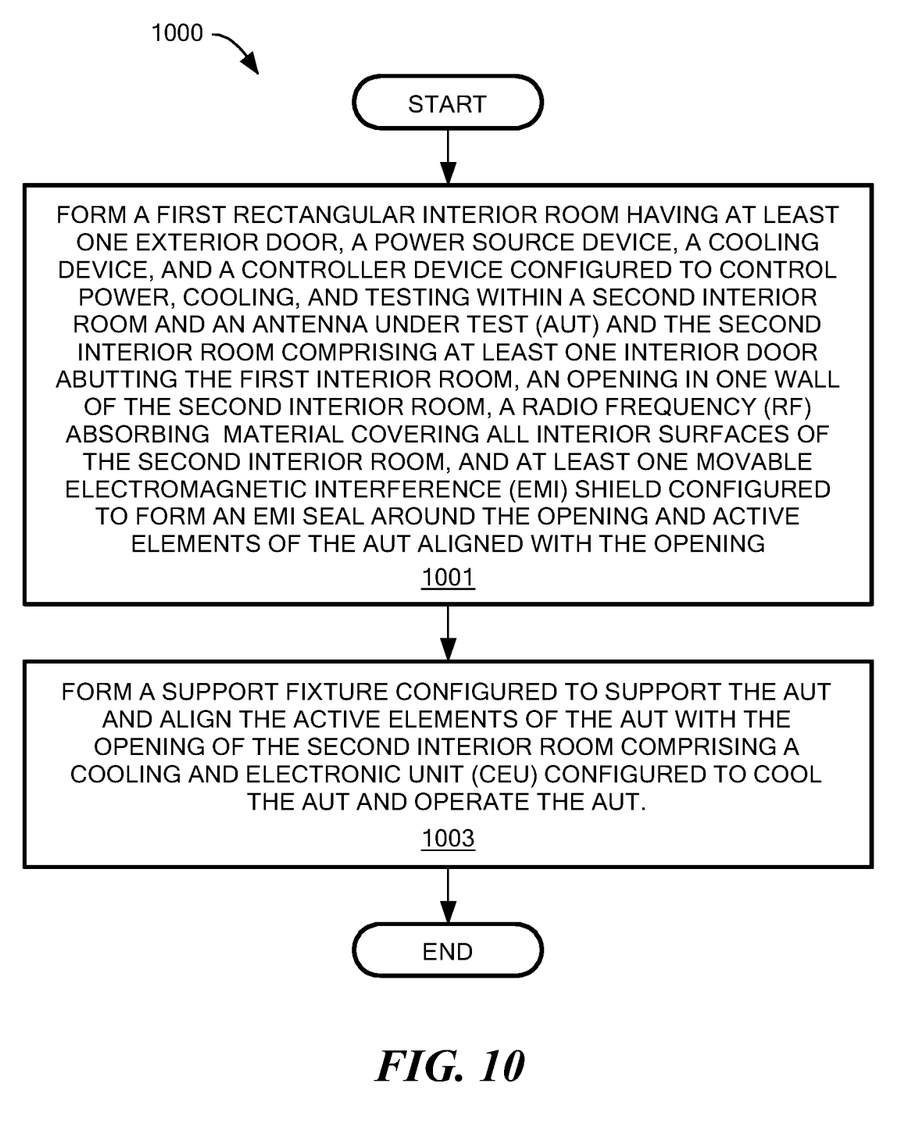
FIG. 10 is an exemplary method of a PACS of the present disclosure.

FIG. 10 is an exemplary method 1000 of a PACS of the present disclosure. method of fabricating a phased antenna array calibration station. The exemplary method 1000 comprises forming an enclosure in step 1001 comprising a first rectangular interior room comprising at least one exterior door, a power source device, a cooling device, and a controller device configured to control power, cooling, and testing within a second interior room and an antenna under test (AUT) and the second rectangular interior room comprising at least one interior door abutting the first interior room, an opening in one wall of the second interior room, a radio frequency (RF) absorbing material covering all interior surfaces of the second interior room, and at least one movable electromagnetic interference (EMI) shield configured to form an EMI seal around the opening and active elements of the AUT aligned with the opening. Step 1003 of the method 1000 comprises forming a support fixture configured to support the AUT and align the active elements of the AUT with the opening of the second interior room comprising a cooling and electronic unit (CEU) configured to cool the AUT and operate the AUT.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

Various embodiments of the concepts, systems, devices, structures and techniques sought to be protected are described herein with reference to the related drawings. Alternative embodiments can be devised without departing from the scope of the concepts, systems, devices, structures and techniques described herein.

It is noted that various connections and positional relationships (e.g., over, below, adjacent, etc.) are set forth between elements in the above description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," 37 comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "at least one" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description herein, terms such as "upper," "lower," "right," "left," "vertical," "horizontal," "top," "bottom," (to name but a few examples) and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements. Such terms are sometimes referred to as directional or positional terms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A phased antenna array calibration station, comprising:
    an enclosure comprising:
        a first rectangular interior room comprising at least one exterior door, a power source device, a cooling device, and a controller device configured to control power, cooling, and testing within a second rectangular interior room and an antenna under test (AUT); and
        the second rectangular interior room comprising at least one interior door abutting the first interior room, an opening in one wall of the second rectangular interior room, a radio frequency (RF) absorbing material covering all interior surfaces of the second rectangular interior room, and at least one movable electromagnetic interference (EMI) shield configured to form an EMI seal around the opening and active elements of the AUT aligned with the opening; and
    a support fixture configured to support the AUT and align the active elements of the AUT with the opening of the second rectangular interior room and comprising a cooling and electronic unit (CEU) configured to cool the AUT and operate the AUT.

2. The phased antenna array calibration station of claim 1, wherein the enclosure comprises a shipping container having a length in a range from 20 feet to 40 feet, a width of at least 8 feet, and a height of at least 8.5 feet.

3. The phased antenna array calibration station of claim 1, wherein the enclosure is a conductive material.

4. The phased antenna array calibration station of claim 1, wherein the second rectangular interior room further comprises a height greater than the first rectangular interior room.

5. The phased antenna array calibration station of claim 1, wherein the RF absorbing material is one of pyramidal RF absorbing material and a wedge absorber, and further comprises a block absorber on a floor of the second rectangular interior room.

6. The phased antenna array calibration station of claim 1, wherein the RF absorbing material has a thickness of 8 inches on all of the interior surfaces of the second rectangular interior room except for a wall opposite the opening, where the RF absorbing material on the wall opposite the opening has a thickness of 12 inches.

7. The phased antenna array calibration station of claim 1, wherein a size of the opening of the second rectangular interior room is a function of operating frequency of the AUT and antenna array size of the AUT.

8. The phased antenna array calibration station of claim 1, further comprising a planar near field scanner (PNFS) in the second rectangular interior room.

9. The phased antenna array calibration station of claim 1, wherein the support fixture further comprises at least one alignment pin and at least one rail for positioning the AUT with respect to the opening in the second rectangular interior room.

10. The phased antenna array calibration station of claim 1, wherein the opening of the second rectangular interior room comprises at least one clamp to secure the support fixture.

11. A method of fabricating a phased antenna array calibration station, comprising:
    forming an enclosure comprising:
        a first rectangular interior room comprising at least one exterior door, a power source device, a cooling device, and a controller device configured to control power, cooling, and testing within a second rectangular interior room and an antenna under test (AUT); and
        the second rectangular interior room comprising at least one interior door abutting the first rectangular interior room, an opening in one wall of the second rectangular interior room, a radio frequency (RF) absorbing material covering all interior surfaces of the second rectangular interior room, and at least one movable electromagnetic interference (EMI) shield configured to form an EMI seal around the opening and active elements of the AUT aligned with the opening; and
    forming a support fixture configured to support the AUT and align the active elements of the AUT with the opening of the second rectangular interior room and comprising a cooling and electronic unit (CEU) configured to cool the AUT and operate the AUT.

12. The method of claim 11, wherein the enclosure comprises a shipping container having a length in a range from 20 feet to 40 feet, a width of at least 8 feet, and a height of at least 8.5 feet.

13. The method of claim 11, wherein the enclosure is a conductive material.

14. The method of claim 11, wherein the second rectangular interior room further comprises a height greater than the first rectangular interior room.

15. The method of claim 11, wherein the RF absorbing material is one of pyramidal RF absorbing material and a wedge absorber, and further comprises a block absorber on a floor of the second rectangular interior room.

16. The method of claim 11, wherein the RF absorbing material has a thickness of 8 inches on all of the interior surfaces of the second rectangular interior room except for a wall opposite the opening, where the RF absorbing material on the wall opposite the opening has a thickness of 12 inches.

17. The method of claim 11, wherein a size of the opening of the second rectangular interior room is a function of operating frequency of the AUT and antenna array size of the AUT.

18. The method of claim 11, further comprising placing a planar near field scanner (PNFS) in the second rectangular interior room.

19. The method of claim 11, wherein the support fixture further comprises at least one alignment pin and at least one rail for positioning the AUT with respect to the opening in the second rectangular interior room.

20. The method of claim 11, wherein the opening of the second rectangular interior room comprises at least one clamp to secure the support fixture.

* * * * *